(12) United States Patent
Abe

(10) Patent No.: US 6,767,826 B2
(45) Date of Patent: Jul. 27, 2004

(54) METHOD OF MANUFACTURING SEMICONDUCTOR DEVICE

(75) Inventor: Kazuhide Abe, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 10/392,933

(22) Filed: Mar. 21, 2003

(65) Prior Publication Data

US 2003/0203619 A1 Oct. 30, 2003

(30) Foreign Application Priority Data

Apr. 26, 2002 (JP) ......................................... 2002-126615

(51) Int. Cl.⁷ .......................................... H01L 21/4763
(52) U.S. Cl. ....................... 438/638; 438/672; 438/687; 438/692; 438/700
(58) Field of Search ................................ 438/630, 638, 438/672, 687, 692, 700

(56) References Cited

U.S. PATENT DOCUMENTS 6,331,479 B1 * 12/2001 Li et al. ...................... 438/618
6,344,693 B1 * 2/2002 Kawahara et al. .......... 257/759
6,559,545 B2 * 5/2003 Morozumi .................. 257/758
6,582,974 B2 * 6/2003 Lui et al. ........................ 438/6
6,617,208 B2 * 9/2003 Saran .......................... 438/240
2001/0027008 A1   10/2001 Matsumoto

FOREIGN PATENT DOCUMENTS

| JP | 09-008039 | 1/1997 |
| JP | 10-229085 | 8/1998 |
| JP | 2001-156071 | 6/2001 |
| JP | 2001-217248 | 8/2001 |

* cited by examiner

*Primary Examiner*—Hsien Ming Lee
(74) *Attorney, Agent, or Firm*—Volentine Francos, PLLC

(57) ABSTRACT

A first insulating layer is formed on first wiring and thereafter an etching resistant film is formed thereon. A lower layer portion of a second insulating layer is formed on the etching resistant film. Upon etching for forming dummy trenches, the rate of etching of the etching resistant film is less than or equal to one-tenth the rate of etching of the insulating layer. Therefore, the etching resistant film functions as an etching stopper and the etching thereof does not proceed to the first insulating layer. Thus, the interval between the corresponding first wiring and a second wiring can be reliably maintained and an increase in parasitic capacitance is hence prevented. An insulator lying within a wiring section is made unnecessary while a dishing phenomenon is prevented, by bottom-up filling of a copper-plated film due to the dummy trenches. Thus, wiring resistance is prevented from increasing.

18 Claims, 6 Drawing Sheets

METHOD OF MANUFACTURING SEMICONDUCTOR DEVICE

BACKGROUND OF THE INVENTION

1. Field of the Invention

The present invention generally relates to a method of manufacturing a semiconductor device, and more particularly to a method of manufacturing a semiconductor device that includes buried wirings formed by using Chemical Mechanical Polishing technique.

This application is a counterpart of Japanese patent application, Serial Number 126615/2002, filed Apr. 26, 2002, the subject matter of which is incorporated herein by reference.

2. Description of the Related Art

A method of manufacturing buried wirings by using a CMP (it is herein after referred to as CMP) method in a semiconductor device manufacturing process has been developed in recent years. According to this method, trench patterns for wirings, which are formed in an insulating film, are first formed, and a conductive layer is deposited thereon, whereby a conductor is embedded in each of the trench patterns. In order to remove the unnecessary conductor other than the conductor embedded in the trench patterns, the conductive layer is thereafter polished by the CMP method until the upper surface of the insulating film is exposed. The conductive layer left only in each of the trench patterns by this polishing is used as a wiring. In the present method, copper pattern processing becomes easy in particular.

However, the aforementioned CMP method will cause a phenomenon that the polishing of the conductive layer in each trench pattern proceeds much more than the polishing on the insulating film. As a result, depressions are formed on a wiring upper surface after the formation of each buried wiring. This is called a "dishing phenomenon". The depth of each depression produced due to this dishing phenomenon increases depending on an open width of each of the trench patterns. When the open width of the trench pattern is 10 µm or more, for example, the depth reaches 150 nm or more. Therefore, the surface to be polished, of a wiring having a broad open width in particular cannot be planarized.

When an interlayer insulating film is formed on the polished surface in which such a dishing phenomenon as described above has occurred, depressions corresponding to the depressions on the polished surface appear on the surface of the interlayer insulating film. Let's assume that an upper layer buried wiring is formed on the interlayer insulating film having the depressions formed in such a surface, by using the CMP method according to a procedure similar to the above. In doing so, the conductive layer remains even within the depressions in addition to within the trench patterns formed in the interlayer insulating film as intended for the wiring. When such a conductive layer is located between the conductive layers used as the original wirings, the wirings not to be originally connected are connected to each other therebetween, thereby causing a short. Thus, when a semiconductor device having a multilayered wiring structure is fabricated, the occurrence of the dishing phenomenon contributes to a reduction in yield.

Therefore, various methods have been proposed to prevent the dishing phenomenon. There is known, for example, a method of providing posts in a wiring trench at narrow intervals of 1 µm or less where wirings each having a broad open width of 10 µm or more, for example (see Japanese Laid-Open Patent No. 9-8039). There is also known a method of defining slits each having a narrow interval within a wiring trench as a method similar to above (see Japanese Laid-Open Patent No. 10-229085). These methods aim to divide the interior of a broad wiring trench into areas each having a narrow width to thereby prevent the dishing phenomenon.

There are also known one wherein a slit trench pattern having a predetermined width is provided in a central portion of a wide wiring trench to increase the thickness of a copper-plated film in a central area of the wide wiring trench, thereby preventing a dishing phenomenon (see Japanese Laid-Open Patent No. 2001-217248), and one provided with a plurality of protrusions which extend out up to some midpoint of a step of an interlayer insulating film (see Japanese Laid-Open Patent No. 2001-156071).

One of these manufacturing methods will be described by using the drawings.

As shown in FIG. 2(A), an insulating film 22 having a predetermined thickness is formed on a semiconductor substrate 21. Afterwards, a wiring 23 is formed on the surface of the insulating film 22 and the insulating film 22 is further deposited to planarize the surface thereof.

Next, opening 24 as a via hole, which extends through to the wiring 23, is defined in the insulating film 22 by anisotropic dry etching with an unillustrated resist as a mask. Simultaneously with it, trench patterns 25 are formed in a central area of a wide wiring trench of the insulating film 22.

Next, as shown in FIG. 2(B), a non-photosensitive organic coating film (antireflection film) 26 is applied onto a surface including the interiors of the opening 24 and the trench patterns 25. Next, a photoresist 27 is patterned thereon. Next, the organic coating film 26 is removed by etching with the photoresist 27 as a mask. Further, an upper layer portion of the insulating film 22 and the organic coating film 26 located at the same height as the upper layer portion are etched using an etching gas of a different kind with the same photoresist 27 as the mask. Afterwards, the photoresist 27, the organic coating film 26 placed under the photoresist 27, and the organic coating film 26 left inside the opening 24 and the trench patterns 25 are removed.

In doing so, narrow wiring trenches 28 and a wide wiring trench 29 are defined in the insulating film 22 together with the opening 24 as shown in FIG. 2(C). The trench patterns 25 obtained by polishing only the heights of the narrow wiring trenches 28 are formed in a central area of the wide wiring trench 29. Afterwards, wirings are formed on surfaces thereof by the CMP method (see Japanese Laid-Open Patent No. 2001-217248).

However, the first two conventional examples are respectively accompanied by a drawback that although the manufacture thereof is relatively easy, the sectional area of the portion used for the conductor for each wiring becomes small due to the insulating posts and the slits and hence wiring resistance increases.

Also the final two conventional examples are respectively accompanied by a drawback that while no insulator exists in the upper layer portion of each wiring and wiring resistance with respect to a current flowing therethrough does not increase, they become rather difficult in manufacture. Namely, there is a need to accurately control the pressure and flow rate of a gas at the etching of the organic coating film and the insulating film, and the time required to execute the etching in order to suitably adjust the heights of the trench patterns. When an adjustment to the depth of each trench pattern goes wrong and the trench pattern is made deep excessively, parasitic capacitance between the wiring located below the trench pattern and the broad wiring will increase where the wiring is located therebelow.

SUMMARY OF THE INVENTION

According to one aspect of the present invention, there is provided a method of manufacturing a semiconductor device, the method includes forming a first insulating layer over a semiconductor substrate; forming an etching resistant film on a first area of the first insulating layer; forming a second insulating layer over the first insulating layer including the etching resistant film; defining a plurality of trenches exposing a surface of the etching resistant film in the second insulating layer; removing a part of surface of the second insulating layer, which is located at an upper portion of the etching resistant film; forming a conductive layer on the second insulating layer including the plurality of trenches; and polishing the conductive layer until the surface of the second insulating layer is exposed.

The above and further objects and novel features of the invention will more fully appear from the following detailed description, appended claims and the accompanying drawings.

DETAILED DESCRIPTION OF THE PREFERRED EMBODIMENT

Figure 1:
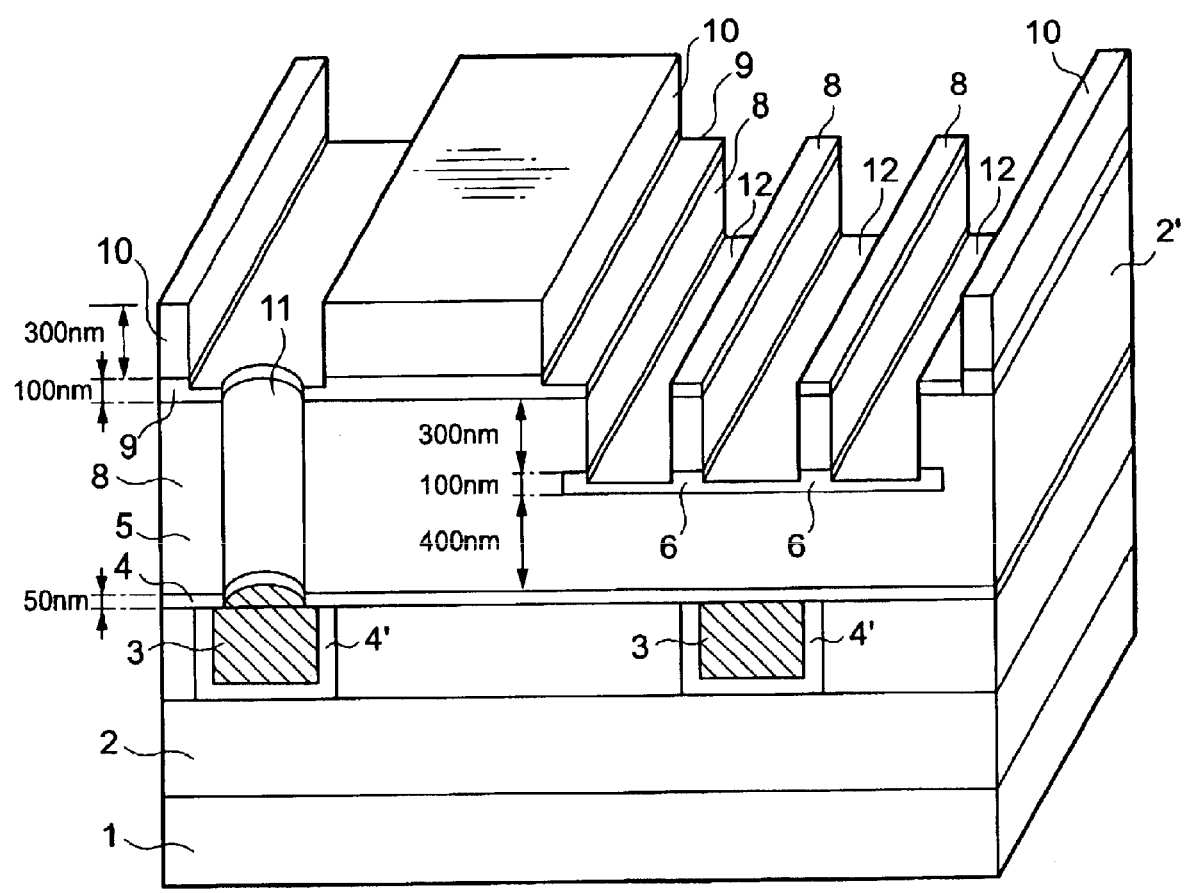
FIG. 1 is a diagram showing a final structure of a semiconductor device of the present invention.
Figure 2A:
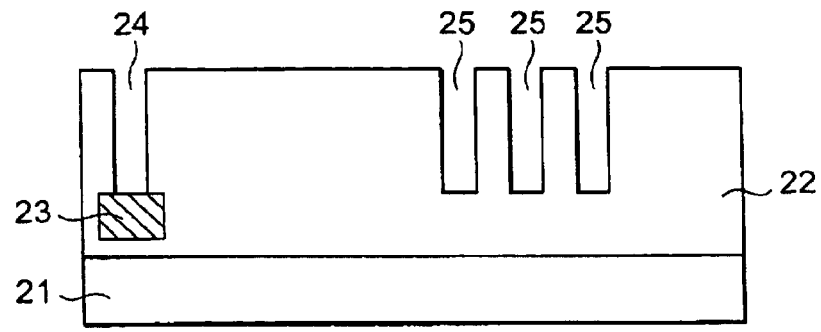
FIG. 2(A) through FIG. 2(C) are process diagrams for describing one example of a conventional manufacturing process.
Figure 2B:
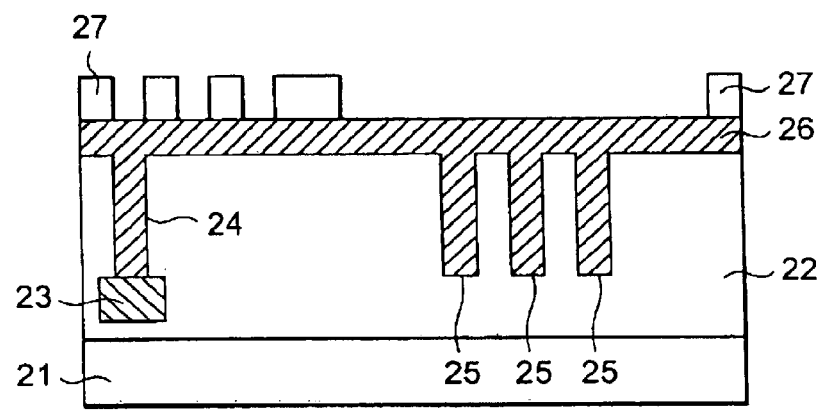
Figure 2C:
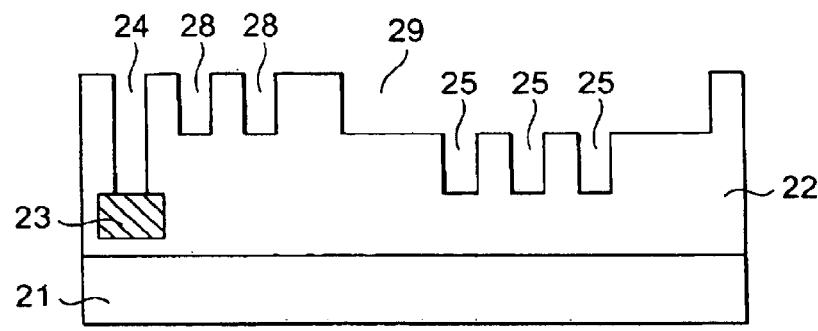

A semiconductor device according to preferred embodiment of the present invention will be explained hereinafter with reference to figures. In order to simplify explanations, like elements are given like or corresponding reference numerals through this specification and figures. Thereby, dual explanations of the same elements are avoided.

FIG. 1 is a diagram showing a final structure of a semiconductor device of the present invention. FIG. 3(A) through FIG. 3(D) and FIG. 4(A) through FIG. 4(D) are process diagrams for describing a process steps according to the present invention.

In FIG. 3($a$), a semiconductor substrate 1 is made up of silicon, for example, and an insulating film 2 is formed on the semiconductor substrate 1. The insulating film 2 is made up of silicon oxide, for example. An insulating film 2', which has grooves and is made up of silicon oxide, is formed on the insulating film 2. A silicon nitride film 4' is formed on inner walls of the insulating film 2'. First wirings 3 each having a trench wiring structure (a buried wiring structure) and composed of Cu are formed on the silicon nitride film 4'. A silicon nitride film (SiN) 4 is deposited 50 nm on the first wirings 3 as a diffusion preventing layer of Cu. Afterwards, a first insulating layer 5 composed of a silicon oxide film is deposited 400 nm thereon as an interlayer insulating layer, and an etching resistant film 6 composed of a silicon nitride film is deposited 100 nm thereon as an etching stopper layer. While the silicon nitride film SiN is used for the silicon nitride film 4 used as the diffusion preventing layer of Cu and the etching resistant film 6 used as the etching stopper layer in the present embodiment, SiC, SiON and SiCN films lower in dielectric constant than them may be used.

Figure 3A:
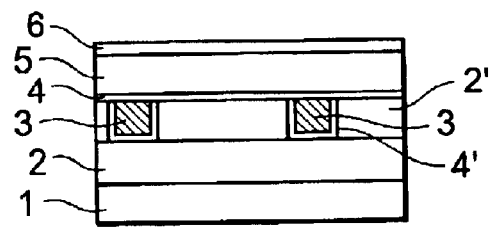
FIG. 3(A) through FIG. 3(D) are process diagrams for describing a process steps according to the present invention.
Figure 3B:
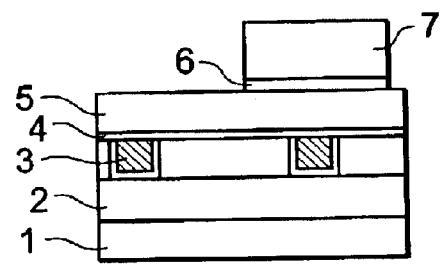
Figure 3C:
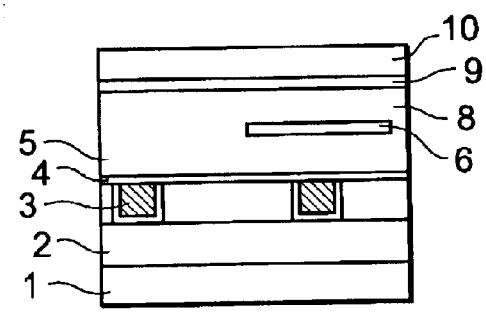

Next, as shown in FIG. 3(B), the etching resistant film 6 other than an under-dummy pattern area (in which a wide wiring will be formed later, which has a wiring width of 10 $\mu$m or more, for example) for plated-film formation to be described later is removed using the well known photolithography technology and etching technology using a photoresist 7. Then, the photoresist 7 is removed. Subsequently, as shown in FIG. 3(C), a lower layer portion 8 of a second insulating layer composed of an silicon oxide film is deposited 300 nm as an interlayer insulating layer, a silicon nitride film 9 used as an etching stopper layer is deposited 100 nm, and an upper layer portion 10 of the second insulating layer composed of the silicon oxide film is deposited 300 nm as a trench forming insulating layer.

Figure 3D:
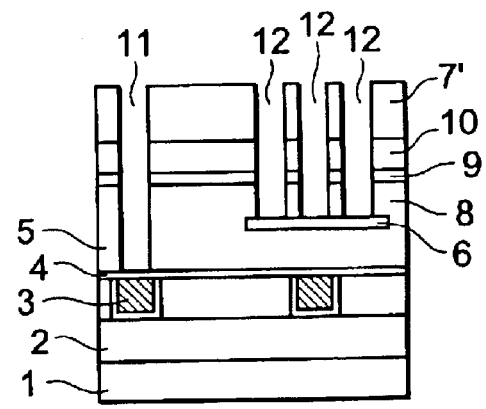

Next, as shown in FIG. 3(D), a via hole (communication hole) 11 and dummy patterns (portions not included in a wiring portion) 12 are formed by a photolithography technology and etching technology using a photoresist 7'. At this time, etching is performed in order of the silicon oxide film (the upper layer portion 10 of the second insulating film) used as the trench forming insulating layer, the silicon nitride film 9 used as the etching stopper layer and the silicon oxide layer (the lower layer portion 8 of the second insulating film) used as the interlayer insulating layer. As gases for etching the silicon oxide film, $C_4F_8$, CO, $O_2$ and Ar are used. On the other hand, a magnetron RIE (Reactive Ion Etching) apparatus is generally used for the etching. At this time, an etching condition is set to $C_4F_8$/CO/$O_2$/Ar=14/50/5/300 sccm, pressure=50 mTorr and RF power=1500 W. In this case, the rate at oxide film etching is about 580 nm/min. Under such a condition, SiN is etched at only a rate of about 54.4 nm/min. Thus, SiN functions as an etching stopper film.

On the other hand, $CH_3$, $CF_4$, $O_2$ and Ar are used as gases for etching the silicon nitride film. At this time, an etching condition at the use of the magnetron RIE apparatus is set to $CHF_3$/$CF_4$/$O_2$/Ar=60/60/5/600 sccm, pressure=170 mTorr and RF power=750 W. Consequently, SiN can be etched at a suitable rate.

The via hole 11 is made open up to the upper surface of the silicon nitride film 4 at a point desired to be electrically connected to the corresponding first wiring 3. On the other hand, respective trenches defined in the dummy patterns 12 are made open up to the upper surface of the etching resistant film 6. Since, at this time, the via hole 11 and dummy patterns 12 different in depth are processed simultaneously, the dummy patterns 12 shallow in depth are overetched.

Since, however, the etching rate for the silicon nitride film is less than or equal to one-tenth that for the silicon oxide film when the silicon oxide film is etched with a mixed gas of $C_4F_8$/CO/$O_2$/Ar, the silicon nitride film serves as the etching stopper layer to the full. Further, dummy slits are disposed with, for example, their widths as 1 µm or less and a dummy density (=dummy slit width/(dummy slit width+ space))=50 to 95%.

As such dummy patterns, may be used, holes or dot shapes other than the slits as shown in FIG. 1.

Figure 5A:
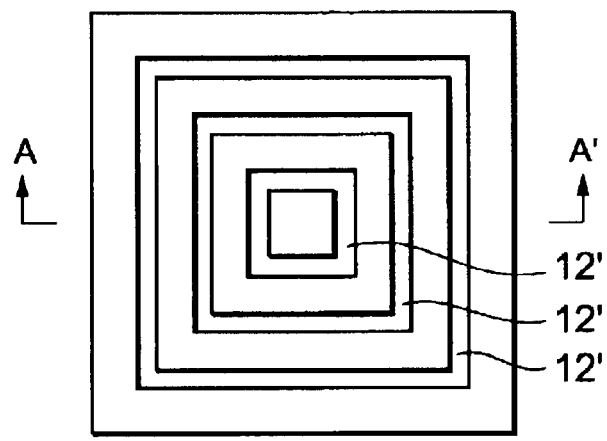
FIG. 5(A) and FIG. 5(B) are diagrams for describing another example of a dummy pattern.
Figure 5B:
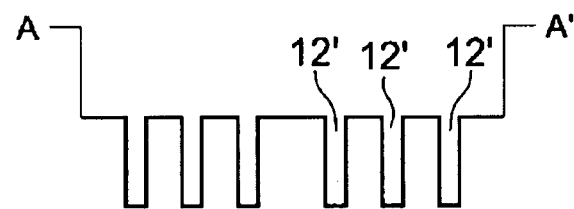
Figure 6A:
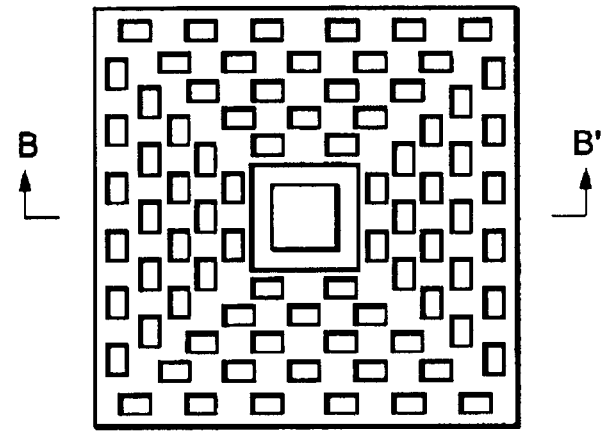
FIG. 6(A) and FIG. 6(B) are diagrams for describing another example of a dummy pattern.
Figure 6B:
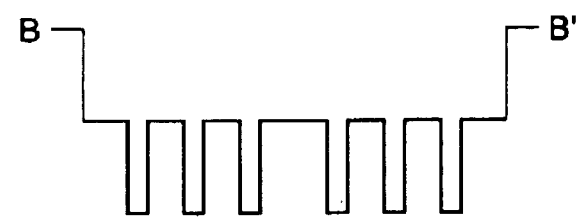

Ones having such shapes as shown in FIG. 5(A), FIG. 5(B), FIG. 6(A) and FIG. 6(B) may be used. FIG. 5(A) is a plan view showing an alternative dummy patterns and FIG. 5(B) is a cross sectional view taken on line A–A' in FIG. 5(A). FIG. 6(A) is a plan view showing an alternative dummy patterns and FIG. 6(B) is a cross sectional view taken on line B–B' in FIG. 6(A)

Dummy patterns shown in FIG. 5(A) and FIG. 5(B) are formed at their corresponding bonding pads provided at terminating portions of wirings included in second wiring patterns. In the example shown in FIG. 5(A), coaxial three trenches as viewed from its upper surface, which is made parallel to the circumference of a bonding pad whose upper surface is square, are defined in association with the bonding pad. The width of each trench is less than or equal to 1 µm. The depth of the trench is set to the same degree to the thickness of the bonding pad as indicated by a cross-sectional view taken along line A–A'. No trench is provided in the center of the bonding pad.

On the other hand, in the example shown in FIG. 6(A) and FIG. 6(B), a large number of holes shaped in rectangles as viewed from their upper surfaces, which have long sides extending in directions parallel to respective sides of a square of a bonding pad whose upper surface is square, are formed in association with such a bonding pad. A trench similar to the innermost trench in the example shown in FIG. 5(A) is defined in the central part of the pattern. The width of the trench is less than or equal to 1 µm. The depths of these holes and trench are set to the same degree as the thickness of the bonding pad as indicated by a cross-sectional view taken along line B–B'. No holes and trench are provided in the center of the bonding pad.

Figure 4A:
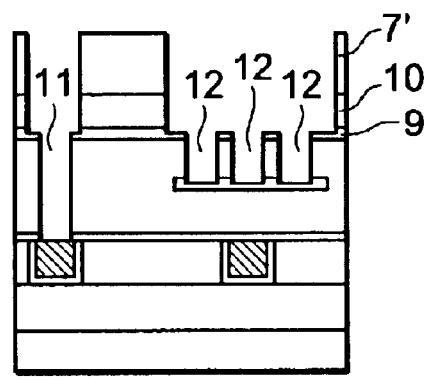
FIG. 4(A) through FIG. 4(D) are process diagrams for describing a process steps according to the present invention.

Next, as shown in FIG. 4(a), a wire-shaped trench is defined in the silicon oxide film (the upper layer portion 10 of the second insulating layer) by using the normal photo-lithography technology and etching technology. At this time, the mixed gas of $C_4F_8/CO/O_2/Ar$ is changed to the mixed gas of $CHF_3/CF_4/O_2/Ar$ after the trench has reached the silicon nitride film 9, whereby the silicon nitride film 4 formed on the corresponding Cu wiring 3 corresponding to the point desired to obtain an electrical connection is removed.

Figure 4B:
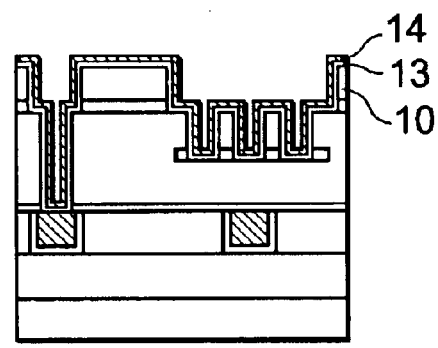

Next, as shown in FIG. 4(b), a barrier film 13 and a Cu seed film 14 are formed. The barrier film 13 functions as a diffusion preventing layer for preventing Cu from being diffused into the insulating layer 10.

In the present embodiment, a TaN film used as the barrier film, and the Cu seed film 14 are respectively formed with thicknesses of 40 nm and 100 nm. Further, the barrier film 13 and the Cu seed film 14 are continuously formed in a vacuum by a sputtering method having high directivity.

Figure 4C:
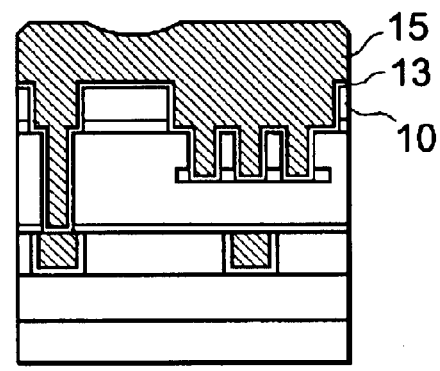
Figure 7:
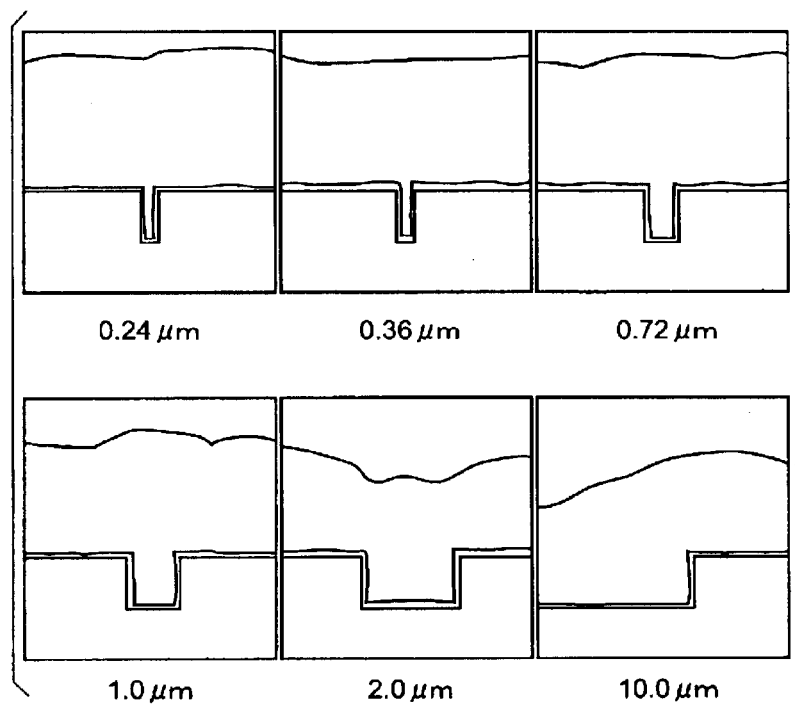
FIG. 7 is a diagram for describing a correlation between the thickness of a copper plate and the width of each trench.
Figure 8:
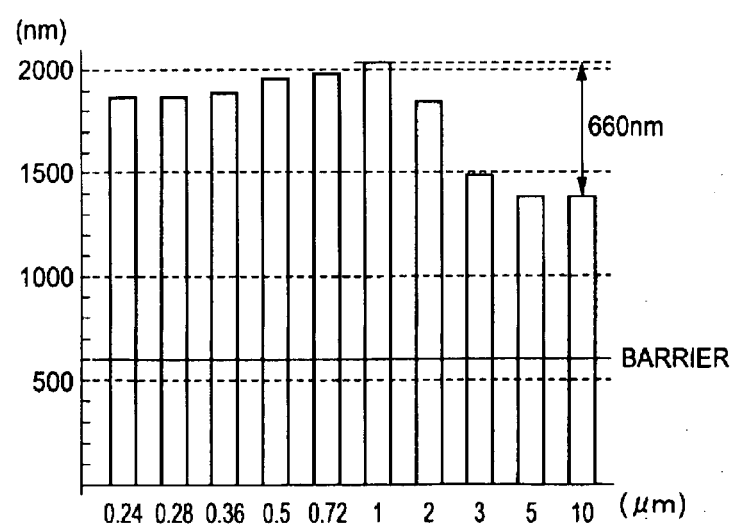
FIG. 8 is a diagram for describing a correlation between the thickness of a copper plate and the width of each trench.

Next, as shown in FIG. 4(C), a sample formed with the Cu seed film 14 is subjected to the atmosphere and conveyed to a plating device, where a Cu-plated film 15 is formed on the Cu seed film 14 by an electroplating method. The Cu-plated film 15 is deposited until the via hole 11 and the trenches of the dummy patterns 12 are perfectly buried thereby. Since, at this time, the Cu-plated film 15 is bottom-up grown at dummy slit portions in the wide wiring provided with the dummy slits, the Cu-plated film is made thick. Experimental data shown in FIG. 7 and FIG. 8 indicate sectional SEM photographs of Cu-plated film thicknesses at various wiring widths and a summary of their film thicknesses. Since any plated-film is deposited by bottom-up growth when the wiring width is 1 µm or less, it is understood that the dependence of the Cu-plated film on each wiring is low. It can be understood from this result that the Cu-plated film can be made thick even in the wide wiring owing to the provision of the dummy slots each having the wiring width of 1 µm or less. With a view toward achieving the stabilization of crystallinity of the Cu-plated film 15, film quality relative to specific resistivity thereof or the like, heat treatment is subsequently performed in an atmosphere of nitrogen and hydrogen at temperatures ranging from 100° C. to 200° C. for 1-5 hours, for example.

Figure 4D:
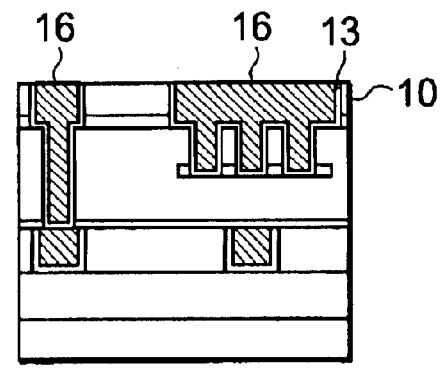

Next, as shown in FIG. 4(D), a metal on the surface of the upper layer portion 10 of the second insulating layer is polished or ground using a CMP method so that its surface is exposed. Thus, Cu wirings 16 each corresponding to a conductive layer remain only within the trenches for the second wiring and dummy patterns 12 and the via hole 11. In the CMP method employed in the present embodiment, slurry to be used is of silica base. With $H_2O_2$ as an oxidizing agent, it is mixed into the slurry.

Further, the semiconductor substrate 1 is held by an unillustrated carrier. The metal on the surface thereof is polished by being pressed against a platen used as an abrasive or polishing cloth. Pressure developed at this time is called a down force. The polishing is performed while the carrier and platen are both being rotated.

The down forces of the carrier and a retainer ring are respectively assumed to be 4[psi] and 5[psi], and rotational speeds of the carrier and platen are respectively assumed to be 80[rpm] and 80[rpm]. A first polish is completed in a state in which the barrier layer 13 is being left behind.

Next, the barrier layer 13 is also perfectly removed using another silica base slurry as a second polish. The down forces of the carrier and retainer ring are respectively assumed to be 4[psi] and 5[psi], and the rotational speeds of the carrier and platen are respectively assumed to be 50[rpm] and 50[rpm].

Further, the process of forming a silicon nitride film corresponding to a Cu diffusion preventing layer similar to the above-described one to the process of forming wirings and plugs are repeatedly performed, thereby making it possible to form a multilayer interconnection or wiring. The method of the present invention is unlimited to the portions for the wide wirings and applied even to portions for bonding pads located at their terminating portions. Dummy patterns corresponding to the portions are not limited to the trench patterns shown in FIG. 1 as described above. The patterns shown in FIG. 5(A), FIG. 5(B), FIG. 6(A) and FIG. 6(B) can be also used.

According to the above-described specific example, since the etching proceeds while the time equivalent to ten times the time taken when the etching of the lower layer portion 8 of the second insulating layer proceeds, is being taken at the etching resistant film 6, the etching can be accurately stopped at the etching resistant film 6. As a result, it is easy to manufacture such a wiring trench structure as shown in FIG. 1.

With the patterning of the etching resistant film 6, the etching resistant film 6 is removed at the portion desired to be connected to the corresponding first wiring 3, so that the via hole 11 can be formed simultaneously with the formation of the dummy patterns 12.

Further, the etching resistant film 6 other than the region below the dummy patterns is fully removed by patterning to thereby make it possible to prevent parasitic capacitance from increasing even when one high in dielectric constant is used as the etching resistant film 6.

Furthermore, the depth of each wiring portion can be also accurately fabricated owing to the provision of a second etching resistant film for the formation of each wiring portion.

Owing to the use of such dummy patterns as shown in FIG. 5(A) and FIG. 6(A) at the portion for the bonding pad, a conductor embedded in its central portion can be reliably built up, thereby making it possible to prevent a dishing phenomenon and ensure wiring connections.

Incidentally, the present invention is not limited to the above-described embodiment, and various modifications can be of course made thereto. While the aforementioned embodiment has described the case in which the wide wiring and the narrow wirings are provided as one pair, they can be simultaneously fabricated even if wide and narrow wirings of any number exist on the semiconductor substrate 1.

According to the present invention as described above in detail, since an etching resistant film for protecting a first insulating layer formed on first wirings from etching is used in a process of manufacturing a semiconductor device, the depth of each dummy pattern can be accurately controlled. Thus, when a lower layer wiring is placed below the dummy patterns, parasitic capacitance between the lower layer wiring and an upper layer wiring can be easily controlled. It is therefore possible to easily manufacture a wiring of a structure having dummy patterns at the bottom. Thus, a semiconductor device can be easily manufactured wherein no insulator exists within a wiring section and no increase in wiring resistance occurs. A dishing phenomenon can be prevented in a polishing process using a CMP method.

While the preferred form of the present invention has been described, it is to be understood that modifications will be apparent to those skilled in the art without departing from the spirit of the invention. The scope of the invention is to be determined solely by the following claims.

What is claimed is:

1. A method of manufacturing a semiconductor device, comprising:
   providing a semiconductor substrate having a contact area and a non-contact area;
   forming a first wiring over the semiconductor substrate;
   forming a first insulating layer over the first wiring and the semiconductor substrate;
   forming an etching resistant film on the first insulating layer within the non-contact area;
   forming a second insulating layer on the etching resistant film and the first insulating layer;
   forming a mask pattern layer on the second insulating layer;
   etching the first and second insulating layers using the mask pattern layer as a mask to simultaneously form a wiring trench in the contact area and a dummy trench in the non-contact area, wherein the dummy trench is formed in the second insulating layer up to the etching resistant film and the wiring trench is formed in the first and second insulating layers so as to expose the first wiring, wherein only the mask pattern layer is used as a mask that defines the dummy trench and the wiring trench;
   forming a conductive layer in the wiring trench and the dummy trench and on a surface of the second insulating layer; and
   polishing the conductive layer until the surface of the second insulating layer is exposed.

2. The method according to claim 1, wherein the dummy trench comprises a coaxial trench as viewed from an upper surface thereof.

3. The method according to claim 2, wherein a depth of the dummy trench is set to a thickness of a second wiring trench in the second insulating layer.

4. The method according to claim 1, wherein a width of the dummy trench is less than or equal to 1 micrometer.

5. The method according to claim 1, wherein the dummy trench comprises a hole shaped as a rectangle.

6. The method according to claim 1, wherein the dummy trench comprises a slit.

7. The method according to claim 1, wherein a depth of the wiring trench is larger than that a depth of the dummy trench.

8. The method according to claim 7, wherein the depth of the wiring trench is more than twice the depth of the dummy trench.

9. A method of manufacturing a semiconductor device, comprising:
   providing a semiconductor substrate having a contact area and a non-contact area;
   forming a first wiring over the semiconductor substrate;
   forming a first insulating layer over the first wiring and the semiconductor substrate;
   forming an etching resistant film on the first insulating layer;
   removing the etching resistant film located in the contact area so that the first insulating layer within the contact area is exposed;
   forming a second insulating layer on the exposed first insulating layer and the remaining etching resistant film;
   forming a mask pattern layer on the second insulating layer;
   simultaneously etching the second insulating layer up to the remaining etching resistant film within the non-contact area to form a dummy trench in the second insulating layer, and etching the first and second insulating layers up to the first wiring within the contact area to form a via hole, wherein only the mask pattern layer is used as a mask during said simultaneously etching to define areas of the dummy trench and the via hole;
   forming a conductive layer within the dummy trench and the via hole, and on a surface of the second insulating layer; and
   polishing the conductive layer until the surface of the second insulating layer is exposed.

10. The method according to claim 9, wherein a depth of the via hole is larger than a depth of the dummy trench.

11. The method according to claim 10, wherein the depth of the via hole is more than twice the depth of the dummy trench.

12. A method of manufacturing a semiconductor device, comprising:
   providing a semiconductor substrate having a first area and a second area;
   forming a first conductive pattern in the semiconductor substrate;
   forming a first etching resistant film on the semiconductor substrate and the first conductive pattern;

forming a first insulating layer over the semiconductor substrate including the first conductive pattern;

forming a second etching resistant film on the first insulating layer within the first area;

forming a second insulating layer on the first insulating layer including the second etching resistant film;

forming a mask pattern layer on the second insulating layer;

forming a through hole exposing a surface of the first etching resistant film and a plurality of trenches exposing a surface of the second etching resistant film in the second insulating layer, wherein only the mask pattern layer is used as a mask during formation of the through hole and the trenches to define areas of the through hole and the trenches;

removing a part of a surface of the second insulating layer, which is located above the second etching resistant film;

removing the first etching resistant film to expose a surface of the first conductive pattern;

forming a conductive layer on the exposed first conductive pattern and the second insulating layer including in trenches; and polishing the conductive layer until the surface of the second insulating layer is exposed.

13. The method according to claim 12, wherein the trenches comprise slits.

14. The method according to claim 12, wherein the trenches comprise coaxial trenches as viewed from an upper surface thereof.

15. The method according to claim 12, wherein the trenches comprise holes shaped in rectangles.

16. The method according to claim 12, wherein a width of each trench is less than or equal to 1 micrometer.

17. The method according to claim 12, wherein a depth of the through hole is larger than a depth of the trench.

18. The method according to claim 17, wherein the depth of the through hole is more than twice the depth of the trench.

* * * * *